United States Patent
Wang et al.

(10) Patent No.: US 9,959,205 B2
(45) Date of Patent: May 1, 2018

(54) SHARED ROW BUFFER SYSTEM FOR ASYMMETRIC MEMORY

(71) Applicant: Wisconsin Alumni Research Foundation, Madison, WI (US)

(72) Inventors: Hao Wang, Madison, WI (US); Nam Sung Kim, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 64 days.

(21) Appl. No.: 14/710,770

(22) Filed: May 13, 2015

(65) Prior Publication Data
US 2016/0335181 A1   Nov. 17, 2016

(51) Int. Cl.
G06F 12/02 (2006.01)
G06F 12/0802 (2016.01)
G11C 13/00 (2006.01)
G06F 3/06 (2006.01)
G11C 11/00 (2006.01)

(52) U.S. Cl.
CPC ........ *G06F 12/0802* (2013.01); *G06F 3/0604* (2013.01); *G06F 3/0611* (2013.01); *G06F 3/0638* (2013.01); *G06F 3/0647* (2013.01); *G06F 3/0683* (2013.01); *G11C 11/005* (2013.01); *G11C 13/0004* (2013.01); *G11C 13/0021* (2013.01); *G11C 13/0023* (2013.01); *G06F 2212/60* (2013.01); *G11C 2207/005* (2013.01)

(58) Field of Classification Search
None
See application file for complete search history.

(56) References Cited

U.S. PATENT DOCUMENTS

| | | | | |
|---|---|---|---|---|
| 5,953,743 A * | 9/1999 | Jeddeloh | ............. | G06F 13/1631 365/230.01 |
| 6,118,462 A * | 9/2000 | Margulis | ............. | G06F 13/1605 345/501 |
| 9,432,298 B1 * | 8/2016 | Smith | ................. | H04L 49/9057 |
| 2006/0107172 A1 * | 5/2006 | Hsueh | ................ | G11B 20/1833 714/752 |
| 2012/0317376 A1 * | 12/2012 | Loh | ...................... | G06F 13/1657 711/154 |
| 2013/0013864 A1 * | 1/2013 | Chung | ................ | G06F 12/0842 711/130 |
| 2013/0013866 A1 * | 1/2013 | Hsu | ........................ | G06F 12/12 711/136 |

OTHER PUBLICATIONS

D. Lee et al; "Tiered-latency DRAM: A low latency and low cost DRAM architecture," in HPCA, 2013, Entire Document 12 pages; US.

(Continued)

*Primary Examiner* — Charles Rones
*Assistant Examiner* — Ryan Dare
(74) *Attorney, Agent, or Firm* — Boyle Fredrickson, S.C.

(57) ABSTRACT

An architecture for improved memory access in asymmetric memories provides a set of shared row buffers that may be freely allocated between slow and fast memory banks of the asymmetric memory. This permits allocation of row buffers dynamically between the slow and fast memory banks to improve execution speeds and also permits a lightweight memory swap procedure for moving data between the slow and fast memory banks with low processor and memory channel overheads.

20 Claims, 3 Drawing Sheets

(56) References Cited

OTHER PUBLICATIONS

Y.H. Son et al.; "Reducing memory access latency with asymmetric DRAM bank organizations," in ISCA, 2013; pp. 380-391; US.
V. Seshadri et al.; "RowClone: Fast and energy-efficient in—DRAM bulk data copy and initialization," in MICRO, 2013; pp. 1-13; US.

* cited by examiner

SHARED ROW BUFFER SYSTEM FOR ASYMMETRIC MEMORY

STATEMENT REGARDING FEDERALLY SPONSORED RESEARCH OR DEVELOPMENT

This invention was made with government support under 1217102 awarded by the National Science Foundation. The government has certain rights in the invention.

CROSS REFERENCE TO RELATED APPLICATION

--

BACKGROUND OF THE INVENTION

The present invention relates to computer memory architectures and in particular to a shared row buffer system for asymmetric memories.

Electronic circuits for providing electronic memory are a principal component of modern computer architectures and provide storage of the instructions of computer programs and the data used by the programs at memory addresses.

There is a trade-off between the capacity or density of electronic memory circuits (how much can be stored) and how quickly the data can be accessed (latency). Typical memory systems may employ a variety of different memory architectures, for example, including multiple levels of cache memory, primary dynamic random access memory and secondary magnetic storage memory. These architectures present a hierarchy of different memory technologies with different capacities and latencies and may be arranged to allow data that is frequently accessed to be available in the low capacity, low latency structures as copied from the high-capacity, high latency structures. The data copied in the low capacity, low latency is constantly changed (through cache management techniques and page swapping) in an attempt to keep copies of the most frequently accessed data in that low latency structure.

It is also known to produce asymmetric memories having some high-capacity, high latency banks (slow) and some low capacity, low latency banks (fast) within a single memory device and typically using a single memory technology. Asymmetric memory has a superficial resemblance to the hierarchical memory structures discussed above, but differs in that normally the data is not held redundantly in the asymmetric memory in order to maximize capacity. Rather, unique data is allocated between the fast and slow portions of the asymmetric memory so that any given data element is held in only one of the fast and slow memory banks at a location ideally comporting with its access frequency.

There is typically a considerable cost in terms of time and processor resources in moving data between portions of the asymmetric memory. Such movement normally entails reading an entire page of data to the processor through a memory channel and then writing it back to the new location. During this time the memory channel is incapacitated and substantial processor resources are used. This cost of moving data makes it difficult to ensure frequently accessed data is in the fast memory banks. This is because changing workload patterns frequently change the identity of the data pages that are most frequently accessed.

SUMMARY OF THE INVENTION

The present invention provides an asymmetric memory that better accommodates changing patterns of data access providing a set of row buffers that are shared between fast and slow memory banks.

Sharing the row buffers provides a lightweight method of moving data between the fast and slow memory banks without incapacitating the memory channel between the memory and the processor or requiring processor involvement. Generally the row buffers provide a vehicle for swapping data by loading the row buffers from one memory bank and then reassigning them to the other memory bank.

Changing data access patterns also can be accommodated by changing the relative number of shared row buffers allocated to a particular slow or fast memory bank, allocating relatively more row buffers to a given memory bank that has become a bottleneck because it holds frequently accessed data.

Specifically, then one embodiment, the invention provides an electronic memory having a first and second memory bank storing data in logical first rows to be accessible through one of at least two row buffers, where the first memory bank has a higher data capacity and larger access latency than the second memory bank. A set of electrically operable switches is positioned between each row buffer and each of the first memory bank and second memory bank, the electrically operable switches configured so that at least one row buffer may be written to by either the first memory bank or second memory bank according to activation of the electrically operable switches.

It is thus a feature of at least one embodiment of the invention to provide shareable extra row buffer that can be used for improving memory access in an asymmetric memory.

The set of electrically operable switches may be further configured so that at least two row buffers may be accessed by either the first memory bank or second memory bank according to activation of the electrically operable switches.

It is thus a feature of at least one embodiment of the invention to provide a simple mechanism for exchanging data between the memory banks by using a conduit provided by two row buffers.

A memory control system may communicate with the electrically operable switches to change a relative number of row buffers communicating with the first memory bank compared to the second memory bank and providing electrical signals.

It is thus a feature of at least one embodiment of the invention to permit the access of the given memory bank to be improved by assigning extra row buffers to the given memory bank to work, in part, in parallel.

The memory control system may provide a dynamic profiling of the execution of processes on an electronic computer accessing the electronic memory and may change the relative number of row buffers according to that profiling to improve cumulative execution speed of the processes.

It is thus a feature of at least one embodiment of the invention to permit dynamic reallocation of row buffers to accommodate changes in relative accessing of the first and second memory banks wider dynamic work load conditions.

The memory control system may further include a writable row-buffer assignment table communicating with the electrically operable switches so that each row buffer communicates with only one of the first and second memory banks at certain time or in certain time window and with a specific one of the first and second memory banks determined by data in the row-buffer assignment table.

It is thus a feature of at least one embodiment of the invention to permit flexible control of the allocation of row buffers between the first and second memory banks, for example, by the memory controller for dynamic allocation during process runtimes.

The electronic memory may further include a writable page table translating a received memory address into a row of one of the first memory bank and second memory bank according to settings of the page table.

It is thus a feature of at least one embodiment of the invention to permit data to be freely allocated between the first and second memory banks invisibly to earlier stages of memory address translation for example, the virtual-to-physical address translation by the operating system.

The page table may be held in the first memory bank.

It is thus a feature of at least one embodiment of the invention to provide a scalable system wherein each electronic memory can hold its on page table.

The electronic memory may include a memory control system moving data from a given row in the second memory bank to a given row in the first memory bank by: (a) controlling the electrically operable switches to connect a given row of the second memory bank to a given row buffer; (b) moving data of the given row of the second memory bank into the given row buffer; (c) controlling the electrically operable switches to connect the given row buffer to the given row of the first memory bank; and (d) moving data of the given row buffer to the given row in the first memory bank.

It is thus a feature of at least one embodiment of the invention to permit the swapping of data between the first and second memory banks internal to the electronic memory without requiring substantial memory channel bandwidth or processor resources.

The memory control system may further move data from the given row in the first memory bank to the given row in the second memory bank concurrently with steps (a)-(d) by: (e) controlling the electrically operable switches to connect the given row of the first memory bank to a second given row buffer; (f) moving data of the given row of the first memory bank into the second given row buffer; (g) controlling the electrically operable switches to connect the second given row buffer to the given row of the second memory bank; and (h) moving data of the second given row buffer to the given row in the second memory bank.

It is thus a feature of at least one embodiment of the invention to eliminate the need for excess storage space in the memory banks for receiving swapped data.

The memory control system may monitor access of rows of the second memory bank to move data from the second memory bank when an access rate of a given row rises above a threshold value.

It is thus a feature of at least one embodiment of the invention to permit dynamic reallocation of data between the first and second memories based on actual data access rates during runtime.

The steps (c), (d), (g), and (h) may be performed only when other new data must be loaded into the given row buffers.

It is thus a feature of at least one embodiment of the invention to minimize the overhead of the data swapped by opportunistically exposing the exposed data for reading and writing before it is returned to the memory banks.

Each of the row buffers may be associated with a dirty bit indicating that the contents of the row buffer have been changed since loading from the first memory bank or the second memory bank and steps (c), (d), (g), and (h) maybe performed by setting the dirty bits of the corresponding given row buffers.

It is thus a feature of at least one embodiment of the invention to employ well understood techniques of detecting a need for data write back or permitting the opportunistic exposure of the data to processes during a memory swap.

The given row of the first memory bank and the given row of the second memory bank may have identical row numbers.

It is thus a feature of at least one embodiment of the invention to provide an extremely lightweight swap protocol by preserving swaps only between corresponding rows.

The first memory and second memory may exchange data from memory cells of each logical row with a corresponding bit of a row buffer, and the first memory may store multiple bits per each memory cell and the second memory cell may store at least one bit in each memory cell and less than the number of multiple bits in each memory cell of the first memory.

It is thus a feature of at least one embodiment of the invention to provide a system that may work with multilevel memory cells to provide asymmetric memory in the same technology by changing the number of discriminated levels for each cell.

These particular objects and advantages may apply to only some embodiments falling within the claims and thus do not define the scope of the invention.

DETAILED DESCRIPTION OF THE PREFERRED EMBODIMENT

Figure 1:
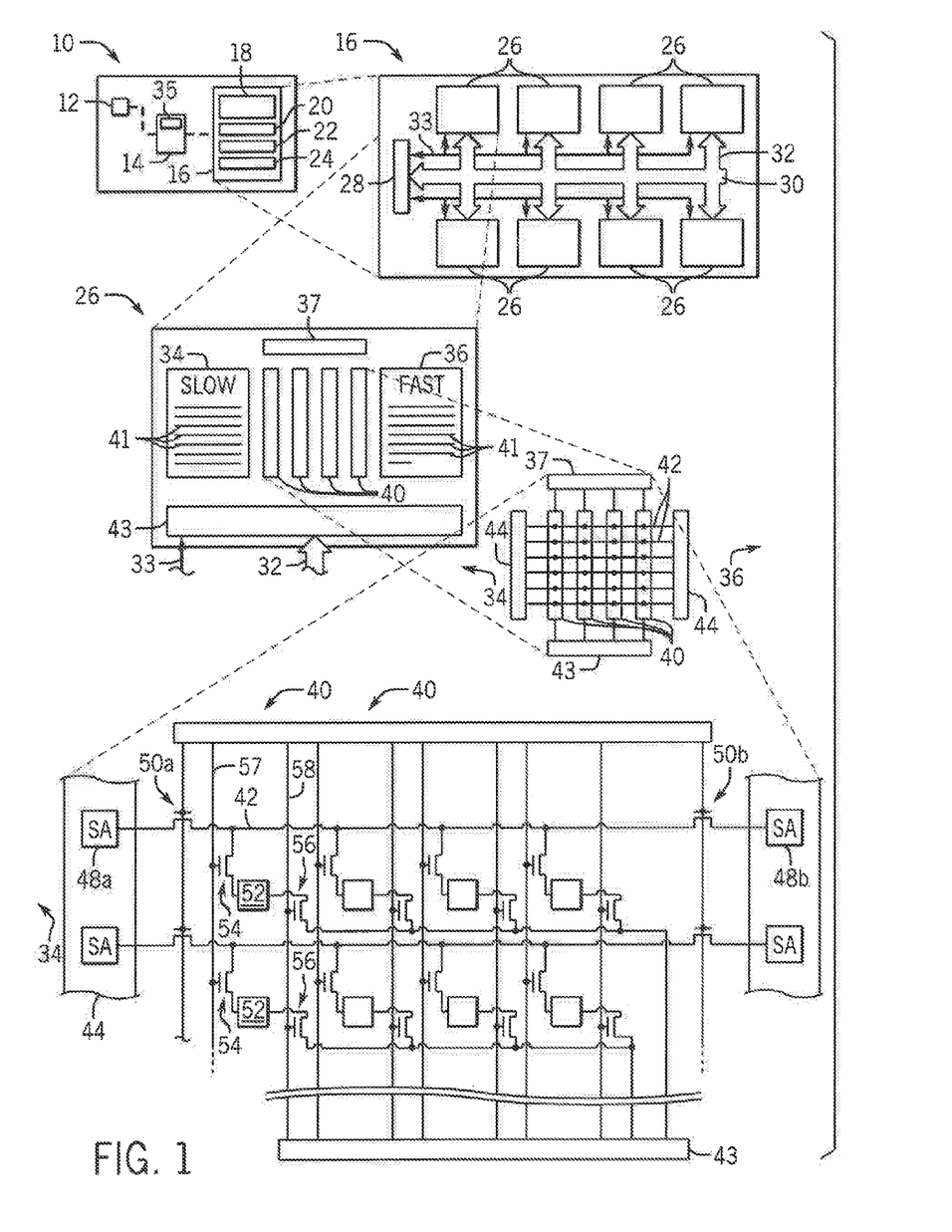
FIG. 1 is a successive set of expanded fragmentary views of a computer system employing the present memory architecture showing in a first expanded fragment multiple memory bank pairs each holding, as shown in a second expanded fragment, fast and slow memory banks, respectively, where pairs of banks share row buffers, as shown in the third expanded fragment, by means of a parallel connection of the row buffers, the shared row buffers and parallel connections implemented through switching transistors and latches as shown in the fourth expanded fragment.

Referring now to FIG. 1, a computer system 10 suitable for use with the present invention may provide one or more processors 12 communicating via a memory controller 14 with a solid-state asymmetric memory 16. The memory controller 14 may be associated with the processors 12 or the asymmetric memory 16 or elsewhere according to various architecture preferences. The memory controller 14 may hold for example, a row-buffer assignment table 35 and cached data from page tables to be described below.

The asymmetric memory 16 may hold instructions and data executable by the processors 12 and may serve as part of a larger memory structure including disk drives and the like (not shown). More specifically, the processors 12 may access instructions and data of the operating system 18, as well as more general programs 22 and program data 24 held in the asymmetric memory 16.

The asymmetric memory 16 may comprise multiple memory bank assemblies 26 communicating with an interface 28 providing access to the asymmetric memory 16. Generally, the interface 28 receives physical memory addresses for accessing data in the asymmetric memory 16 and exchanges data held at those physical memory addresses. Within the asymmetric memory 16, the interface communicates addresses and data with each of the bank assemblies 26 by a wide data bus 30 that splits as two narrow data buses 32 to each of the bank assemblies 26. For example, the wide data bus 30 may provide 64-bit data paths and the narrow data buses 32 may provide 32-bit wide data paths dividing between the upper memory bank assemblies 26 and the lower memory bank assemblies 26. Additional control lines 33 communicate between the interface 28 and the bank assemblies 26.

Referring still to FIG. 1, each bank assembly 26 includes asymmetric memory banks composed of "slow" memory banks 34 and paired "fast" memory banks 36. The designations of "slow" and "fast" as used in this context refer only to relative speeds between the two memory banks 34 and 36 and reflect the underlying qualities of higher density or capacity for slow memory banks 34 and lower density or capacity for fast memory banks 36. The slow and fast memory banks 34 and 36 will normally use the same memory technology and be fabricated on the same integrated circuit substrate. For example, the slow and fast memory banks 34 and 36 may be resistive memory technologies and the asymmetry of fast or slow generated by changing the number of bits that may be stored in a given element of the memory banks 34 or 36 as discriminated by different levels of resistance in the material of the data element.

For example, the memory technology of the memory banks 34 and 36 may include phase change memory (PCM) or magnetoresistive random access memory (MRAM) or other similar technologies that readily adapt asymmetric construction. In this regard, the slow memory banks 34 may hold more bits per memory cell than the fast memory banks 36. For example, the slow memory banks 34 may provide multi-level cells storing two or three bits per memory cell and the fast memory banks 36 may provide single level cells storing only a single bit per memory cell. The memory cells of each of the slow memory banks 34 and fast memory banks 36 may be arranged in addressable rows 41 typically containing an equal number of memory cells but in a different number of bits because of the asymmetry in the number of bits per cell stored by the slow memory banks 34 and fast memory banks 36.

Referring still to FIG. 1, the slow memory bank 34 and fast memory bank 36 communicate with the narrow data bus 32 via a multiplexer 43 and through shared row buffers 40. Each row buffer 40 is sized to receive and buffer a full row of data for a smaller of the number of bits of the row 41 of the slow memory bank 34 and fast memory bank 36 (e.g., typically the number of bits of the fast memory bank 34). If the slow memory banks 34 stores two or three bits per memory cell, each time a memory access occurs for the slow memory bank 34, only a half or one third of the bits in a row of the slow memory bank 34 is loaded in the row buffer 40 and successive accesses are required to obtain a full row of data.

Control circuitry 37, to be described below, controls the flow of data between the slow memory bank 34 and fast memory bank 36 and the row buffers 40 and the multiplexer 43 to prevent data conflicts or races under this sharing. Generally, a given row buffer 40 may be used with either the slow memory bank 34 or fast memory bank 36 but only one of the slow memory bank 34 or fast memory bank 36 at any given time.

Referring still to FIG. 1, each of the row buffers 40 may communicate with either one of the slow memory bank 34 or fast memory bank 36 using a shared bus formed of a set of interconnecting parallel memory access lines 42 terminating at either end at sense amplifiers 44a and 44b communicating, respectively, with the slow memory hank 34 and fast memory bank 36. In this example, only a reading, of data from the slow memory bank 34 or fast memory bank 36 to a row buffer 40 will be described; however, it will be understood that similar circuitry may allow for a writing of data from a row buffer 40 to one of the slow memory bank 34 or fast memory bank 36.

During a reading of data from either the slow memory bank 34 or fast memory bank 36, only one of the given pair of sense amplifiers 48a and 48b for each memory access line 42 communicates with the memory access line 42 through an activated sense amplifier gate 50a or 50b (here implemented as a single transistor). Corresponding sense amplifiers 48 for the remaining memory access lines 42 will be connected correspondingly for a full row of data communicating with the given row buffer 40.

Data from a data element connected to the sense amplifier 48a or 48b may then pass along the memory access line 42 to inputs of latch cells 52 in a given column for a single row buffer 40 as determined by bank access gates 54 (here implemented by a single transistor) for that row as activated by a bank control line 57 controlled by the control circuitry 37. The particular bank control line 57 (and hence bank access gates 54) and the activation of sense amplifier gates 50 will determine a mapping between a row buffer 40 and one of the memory banks 34 and 36, this mapping winch may be flexibly reallocated as will be discussed below.

Data may then pass from each of the latch cells 52 of that given row buffer 40, for example, in a later clock cycle, to the multiplexer 43 by activation of a I/O control line 58 for one row of one row buffer 40 per I/O control line 58. The activation of the I/O control line 58 turns on I/O access gates 56 providing data from the latch cells 52 of a row to the multiplexer 43

The control circuitry 37 may provide for flexible mapping or association between any of the row buffers 40 and either of the slow memory bank 34 and fast memory bank 36 by controlling the gates 50, 54 and 56 appropriately.

As noted above, similar structure (not shown for clarity) provides for the passage of data from the multiplexer 43 back to a given row buffer 40 and then to either slow memory bank 34 or fast memory bank 36 according to the same mapping.

Adaptive Asymmetrical Row Buffers

Figure 2:
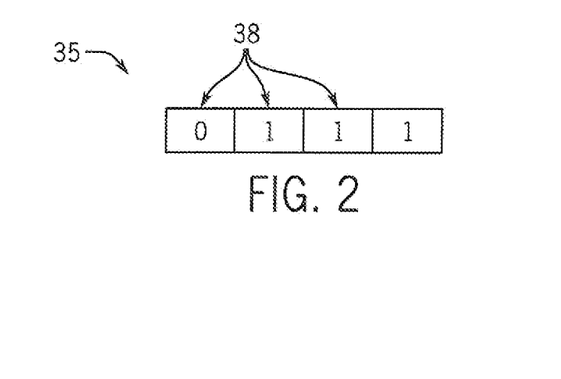
FIG. 2 is a logical diagram of a row-buffer assignment table flexibly assigning row buffers to different ones of the fast and slow memory banks.

Referring also to FIG. 2, memory controller 14 may hold a row-buffer assignment table 35 having, for example, a single bit entry 38 for each row buffer 40 that indicates whether the row buffer 40 is associated with the slow memory bank 34 (e.g. if the entry is zero) or the fast memory bank 36 (e.g. if the entry is one). The particular assignment of row buffer 40 to individual memory banks 34 or 36 may be invisible to other portions of the computer system 10 and may be set, for example, by the memory control circuitry 37.

Once this association between a row buffer 40 and one of the slow memory bank 34 and fast memory bank 36 is established, the control circuitry 37 handles memory access requests for a particular address using whatever row buffer 40 is available for data transfer (meaning that it has completed a transfer process to either the memory bank 34 or 36 or to the multiplexer 43) and associated with the particular slow memory bank 34 or fast memory bank 36 holding the desired data. This latter determination of the location of the desired data in slow memory bank 34 or fast memory bank 36 will be made by means of an asymmetry page table 60 to be described below.

Generally, the more row buffers 40 that are assigned to a given slow memory bank 34 or fast memory bank 36, the faster access of data from that given slow memory bank 34 or fast memory bank 36. This benefit of additional row buffers 40 arises because the timing of transfer of data from the memory banks 34 or 36 permits parallel transfers through multiple row buffers 40 if those row buffers are available.

As noted, the entry of the data in the row-buffer assignment table 35 may be preset by program instructions, the operating system, or compiler commands. Alternatively, and referring to FIG. 3, writing to the row-buffer assignment table 35 may be performed on a dynamic basis, for example, by the operating system 18 or other circuitry, so that the number of row buffers 40 assigned to either the slow memory bank 34 or fast memory bank 36 changes dynamically to improve the cumulative execution time of pending processes of executing programs.

Figure 3:
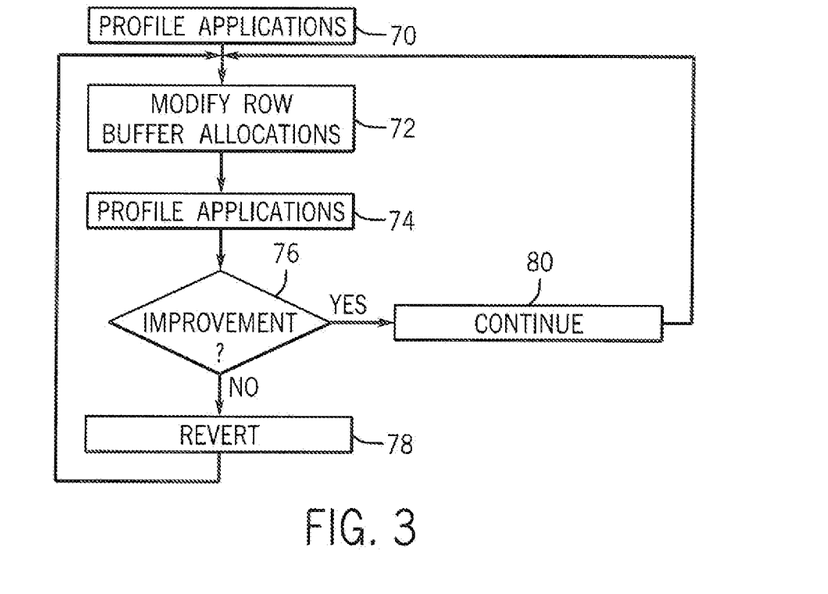
FIG. 3 is a flowchart showing the steps of allocating data to the fast and slow memory banks according to dynamic profiling of processes.

In this process, per process block 70 various application programs (e.g., 22 in FIG. 1) may be profiled with respect to their execution speeds, for example, measuring average completion times of the program or process or numbers of instructions executed per unit time. At process block 72, the allocation of the row buffers 40 to either the slow memory bank 34 or fast memory bank 36 may be perturbed slightly from its existing state in a predetermined direction, for example, by moving one row buffer 40 from slow memory bank 34 to fast memory bank 36. A second profiling is then performed at process block 74, and at decision block 76 the profile of process block 70 and process block 74 are compared to see if there is an improvement with the perturbed allocation.

If there has been no improvement, the previous row buffer state (reflecting the previous allocation of the perturbed row buffer 40 to either the slow memory bank 34 or fast memory bank 36) is restored per process block 78 and an opposite direction of perturbation is adopted at the next execution of process blocks 72. If one row buffer 40 was moved from the slow memory bank 34 to the fast memory bank 36, then the opposite direction of perturbation would move a row buffer 40 from the fast memory bank 36 to the slow memory bank 34.

If there is an improvement detected at decision block 76, then at process block 80 the perturbed allocation of row buffers 40 is preserved and the next execution of process block 72 continues with the current direction of perturbation. In this way a "hill climb" optimization of execution speed as affected by the availability of row buffers 40 is implemented. It will be appreciated that other optimization techniques can be performed, for example, by measuring execution metrics that reflect memory bound processing times and adjusting the row buffers accordingly.

Lightweight Page Migration

Referring now to FIG. 2, the present invention also facilitates the movement of data (for example, page data) between the slow memory hank 34 and fast memory bank 36 allowing page data locations to be dynamically changed to improve data access speed, for example, by profiling measures of page access frequency. For this purpose, a memory control system 39 that may be flexibly implemented by any combination of the control circuitry 37, the memory controller 14, and operating system 18 executed by the processor 12 may provide for dynamic mapping or association between any page address and a location in either the slow memory bank 34 or fast memory bank 36. This dynamic mapping may be recorded in an asymmetry page table 60, for example, stored in memory 16 and in one embodiment stored in the fast memory bank 36, for example, at a reserved known location of the first rows of that bank 36, and cached in memory controller 14.

Figure 4:
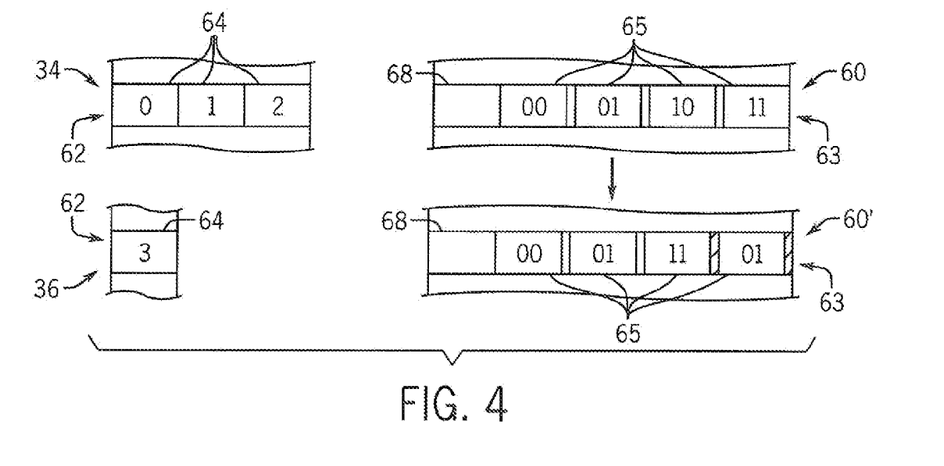
FIG. 4 is a logical diagram of two rows in different memory banks together providing a logical page group and showing entries in a page table before and after a page swap between memory banks.

In one embodiment, the mapping process is simplified by limiting the transfer of data to full pages and only between identically numbered rows 62 of the slow memory bank 34 and fast memory bank 36. For example, a page group of four pages 64, may comprise three pages 64 held in a row 62 of the slow memory bank 34 and one page 64 held in identically numbered row 62 of the fast memory bank 36. Any pair of pages between the slow memory bank 34 and fast memory bank 36 may be swapped to optimize data access speeds.

In order to track the location of the pages 64 and thus allow for their reliable access, the asymmetry page table 60 provides an entry 63 for each row of the memory banks that records the location of the pages 64 as being in either the slow memory bank 34 or fast memory bank 36. For example, each entry 63 of the asymmetry page table 60 may hold four logical page number slots 65 holding addresses of pages and ordered in a way that uniquely describes the location pages in the memory banks 34 and 36. In this example, the first three page number slots 65 in the entry 63 (holding an identification of pages 0, 1 and 2) are by convention associated with the slow memory bank 34, and the last page number slot 65 (holding an identification of page 3) by convention designates the corresponding row 62 of the fast memory bank 36. The asymmetry page table 60 thus provides a location of each page as between the slow memory bank 34 and fast memory bank 36.

Associated with the four logical page number slots 65 is a dirty bit 66 whose use will be described below. In memory controller 14, part of all entries 63 are cached similar to the well understood TLB approach. In this asymmetry page table cache, each entry 63 is also associated with a tag 68 in the TLB that links the entry 63 to the higher order bits of the memory address of the pages 0-3.

The process of decoding a received memory address designating a page at the asymmetric memory 16, first converts the upper-level bits of the address of that page into a tag that may be used to identify the entry 63 in the asymmetry page table 60. This conversion may use standard memory translation techniques, for example, similar to those for calculating cache tags, as may be implemented by the memory controller 14. The resulting tag is then matched to a tag 68 to obtain the location of the necessary entry 63 of the asymmetry page table 60 relevant to the page being accessed.

The location of a given logical page of the received address in either the slow memory bank 34 or fast memory bank 36 may then be obtained by decoding the lower order bits of the memory address to identify the page number and then searching for that page number among the page number slots 65. The order of the page number slots 65 holding a matching page number then indicates where the data resides, being in either the slow memory bank 34 or fast memory bank 36.

For this purpose, asymmetry page table 60 acts in the manner analogous to a page table and may therefore be augmented with a translation lookaside buffer structure as is generally understood in the art. It will be understood that the asymmetry page table 60 allows data to be flexibly allocated to either the slow memory bank 34 or fast memory bank 36 invisibly to the rest of the computer system 10 including the memory controller, 14 greatly simplifying computer design.

Figure 5:
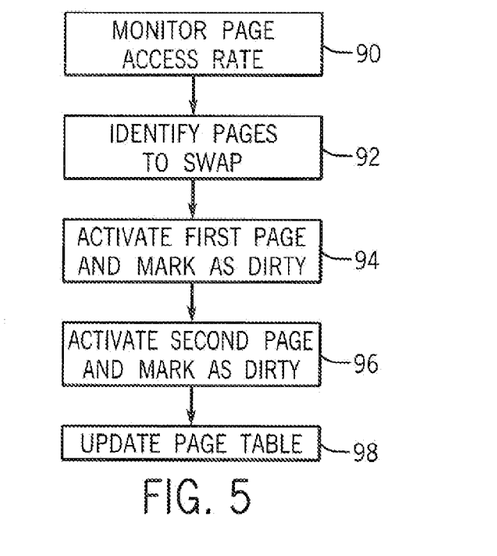
FIG. 5 is a flowchart showing the steps of a lightweight page migration between memory banks using shared row buffers.

Referring now also to FIG. 5, the asymmetry page table 60 and the shareable row buffers 40 provide a structure that may be used to move pages 64 quickly between slow memory bank 34 and fast memory bank 36 with little processor involvement. This swapping may be performed at any time by instructions from the operating system or the program itself or may be performed dynamically based on the monitoring of the relative access rates of the pages 64. In this latter technique, page information is move between the slow memory bank 34 and fast memory bank 36 so that pages 64 with higher access rates are moved to the faster memory bank 36.

Specifically, and as indicated by process block 90, the access rate of each page 64 may be monitored, for example, by recording page accesses in an external page table (not shown) associated with the memory controller 14 or alternatively with corresponding bits held in asymmetry page table 60.

At process block 92, this monitoring information may be used to identify pairs of pages 64 in a page group that should be swapped between slow memory bank 34 and fast memory bank 36, moving one page (for example, page 3) from the fast memory bank 36 to the slow memory bank 34 and a corresponding victim page (for example, page 2) from the slow memory bank 34 to the fast memory bank 36.

At process block 94, the page 64 from the slow memory bank 34 may be "activated" by moving the data of the page 64 to a row buffer 40. At this time the corresponding page dirty bit 66 in asymmetry page table 60 is marked as dirty as shown in the modified asymmetry page table 60 of FIG. 4.

Likewise at process block 96, the victim page 64 (for example, page 3) is activated by moving it to a different row buffer 40 in parallel with process block 94. As with page 2, the corresponding dirty bit 66 in asymmetry page table 60' is marked as dirty.

At process block 98, the page numbers of activated pages 64 as recorded in the asymmetry page table 60' are corrected to show the new locations of these pages, and the bits corresponding to the two row buffers 40 are updated in row-buffer assignment table 35 to ensure the pages will be written back to the correct bank after swapping.

Actual movement of the swapped pages out of the row buffers 40 back into the memory banks 34 and 36 according to their new placement need not be done until the row buffers 40 holding the swapped pages are required for other purposes. At that time the dirty bits indicate that the page data in the row buffers 40 must be evicted or written back to the memory banks 34 and 36 and this is performed.

Delaying this write back of the swapped pages opportunistically allows the data in the row buffers 40 as part of that swapping to also be used for data accesses that may occur around that time. Note that this swapping technique does not use the memory channel of wide data bus 30 or narrow data bus 32 and thus does not interfere with other memory access operations. In addition, minimal or no processor resources are required.

Assuming the swapping operation is triggered by a memory request for the page 2, the page 3 may be written back on an "eager basis" because it was unlikely to be useful for a subsequent memory access request. This is because it was activated simply as a victim to allow page 2 to be moved to the fast memory bank 36. Generally, a row buffer 40 that does not have the dirty bit set, can be reallocated at the end of a time interval, say 1 ms.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to a processor" or the like can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory cells and/or components that can be internal to the processor-controlled device, external to the processor-controlled device, and can be accessed via a wired or wireless network. References to circuitry may include combinations of dedicated and generalized programmable circuitry and the software associated with muscle otherwise indicated.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

We claim:

1. An electronic memory comprising:
a first memory bank storing data in logical first rows to be accessible through at least one row buffer;
a second memory bank storing data in logical second rows to be accessible through at least one row buffer wherein the first memory bank has a higher data capacity and larger access latency than the second memory bank;
a set of at least two row buffers; and
a set of electrically operable switches between each row buffer and the first memory bank and second memory bank, the electrically operable switches configured so that a given row buffer can exchange data with the first memory bank or in the alternative with the second memory bank according to activation of the electrically operable switches so that each row buffer may transfer data within the electronic memory between the first memory bank and the second memory bank.

2. The electronic memory of claim 1 wherein the set of electrically operable switches are configured so that at least two row buffers may be accessed by either the first memory bank or second memory bank according to activation of the electrically operable switches.

3. The electronic memory of claim 1 further including a memory control system communicating with the electrically operable switches to change a relative number of row buffers communicating with the first memory bank compared to the second memory bank and providing electrical signals.

4. The electronic memory of claim 3 wherein the memory control system provides a dynamic profiling of execution of processes on an electronic computer accessing the electronic memory and changes the relative number of row buffers according to that profiling to improve cumulative execution speed of the processes.

5. The electronic memory of claim 1 further including a writable row assignment table communicating with the electrically operable switches so that each row buffer communicates at any given time with only one of the first and second memory banks and with a specific one of the first and second memory banks determined by data in the row assignment table.

6. The electronic memory of claim 1 further including a writable page table translating a received memory address into a row of one of the first memory bank and second memory bank according to settings of the page table.

7. The electronic memory of claim 6 wherein the page table is held in the first memory bank.

8. The electronic memory of claim 1 further including a memory control system moving data from a given row in the second memory bank to a given row in the first memory bank by:
(a) controlling the electrically operable switches to connect a given row of the second memory bank to a given row buffer;
(b) moving data of the given row of the second memory bank into the given row buffer;
(c) controlling the electrically operable switches to connect the given row buffer to the given row of the first memory bank; and
(d) moving data of the given row buffer to the given row in the first memory bank.

9. The electronic memory of claim 8 wherein the memory control system further moves data from the given row in the first memory bank to the given row in the second memory bank concurrently with steps (a)-(d) by:
(e) controlling the electrically operable switches to connect the given row of the first memory bank to a second given row buffer;
(f) moving data of the given row of the first memory bank into the second given row buffer;
(g) controlling the electrically operable switches to connect the second given row buffer to the given row of the second memory bank; and
(h) moving data of the second given row buffer to the given row in the second memory bank.

10. The electronic memory of claim 9 wherein the memory control system monitors access of rows of the second memory bank to move data from the second memory bank when an access rate of a given row rises above a threshold value.

11. The electronic memory of claim 9 wherein steps (c), (d), (g), and (h) are performed only when new data must be loaded into the given row buffers.

12. The electronic memory of claim 9 wherein each of the row buffers are associated with a dirty bit indicating that contents of the row buffer have been changed since loading from the first memory bank or the second memory bank and wherein steps (c), (d), (g), and (h) are performed by setting dirty bits of corresponding given row buffers.

13. The electronic memory of claim 9 wherein the given row of the first memory bank and the given row of the second memory bank have identical row numbers.

14. The electronic memory of claim 1 wherein each of the rows of the first and second memory banks are mapped to disjoint logical addresses.

15. The electronic memory of claim 1 wherein the first and second memory banks are on a common integrated circuit substrate employing architectures fabricatable in parallel.

16. The electronic memory of claim 1 wherein the first memory and second memory exchange data from memory cells of each logical row with a corresponding bit of a row buffer and wherein the first memory stores multiple bits per each memory cell and the second memory cell stores at least one bit in each memory cell and less than a number of multiple bits in each memory cell of the first memory.

17. The electronic memory of claim 16 wherein the first and second memory banks are resistive memories and storing data as variations in resistance of a material of a data cell.

18. The electronic memory of claim 17 wherein the first and second memory are phase change memories changing a resistance of the material of the data cell by a phase change process.

19. The electronic memory of claim 1 wherein the set of electrically operable switches between each row buffer and the first memory bank and the second memory bank also allow each row buffer to be switched between a read path and write path of the first and second memories respectively.

20. The electronic memory of claim 1 further including an interface adapted for communication between each row buffers and at least one external processor; and
wherein each row buffer may transfer data between the first memory bank and the second memory bank or between a memory bank and the external processor via the interface.

* * * * *